(12) United States Patent
Ishizaka

(10) Patent No.: US 11,152,260 B2
(45) Date of Patent: Oct. 19, 2021

(54) EMBEDDING METHOD AND PROCESSING SYSTEM

(71) Applicant: TOKYO ELECTRON LIMITED, Tokyo (JP)

(72) Inventor: Tadahiro Ishizaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/574,672

(22) Filed: Sep. 18, 2019

(65) Prior Publication Data

US 2020/0098627 A1   Mar. 26, 2020

(30) Foreign Application Priority Data

Sep. 20, 2018  (JP) .............................. JP2018-176468

(51) Int. Cl.
| | | |
|---|---|---|
| *H01L 21/768* | (2006.01) | |
| *H01L 21/285* | (2006.01) | |
| *H01L 21/67* | (2006.01) | |

(52) U.S. Cl.
CPC .. *H01L 21/76882* (2013.01); *H01L 21/28556* (2013.01); *H01L 21/67017* (2013.01); *H01L 21/76843* (2013.01); *H01L 21/76877* (2013.01); *H01L 21/76879* (2013.01)

(58) Field of Classification Search
None
See application file for complete search history.

(56) References Cited

U.S. PATENT DOCUMENTS

| | | | | |
|---|---|---|---|---|
| 9,589,836 | B1* | 3/2017 | Zhang | H01L 21/76877 |
| 2001/0026963 | A1* | 10/2001 | Itatani | C23C 16/40 |
| | | | | 438/149 |
| 2003/0022521 | A1* | 1/2003 | Won | H01L 21/28556 |
| | | | | 438/761 |
| 2006/0121733 | A1* | 6/2006 | Kilpela | H01L 21/32051 |
| | | | | 438/681 |
| 2008/0237859 | A1* | 10/2008 | Ishizaka | H01L 21/76855 |
| | | | | 257/751 |
| 2009/0045514 | A1* | 2/2009 | Ishizaka | C23C 16/36 |
| | | | | 257/751 |
| 2011/0165780 | A1* | 7/2011 | Kanjolia | C23C 16/45525 |
| | | | | 438/785 |
| 2017/0092590 | A1* | 3/2017 | Spooner | H01L 21/76814 |
| 2017/0110368 | A1* | 4/2017 | Yu | H01L 21/76826 |
| 2017/0221718 | A1* | 8/2017 | Tapily | H01L 21/3081 |
| 2017/0243827 | A1* | 8/2017 | Simon | H01L 21/76877 |

(Continued)

FOREIGN PATENT DOCUMENTS

| | | |
|---|---|---|
| JP | 2008-022021 A | 1/2008 |
| KR | 1020110014191 A | 2/2011 |

(Continued)

*Primary Examiner* — Erik T. K. Peterson
(74) *Attorney, Agent, or Firm* — Nath, Goldberg & Meyer; Jerald L. Meyer; Tanya E. Harkins

(57) ABSTRACT

An embedding method includes: removing a metal oxide film at a surface of a metal layer from a substrate that includes the metal layer on a bottom of a recess formed in an insulating layer; covering the surface of the metal layer by embedding ruthenium in the recess from the bottom of the recess; forming a ruthenium liner film in the recess; and further embedding ruthenium in the recess in which the liner film is formed.

5 Claims, 18 Drawing Sheets

(56) References Cited

U.S. PATENT DOCUMENTS

| | | | |
|---|---|---|---|
| 2017/0271512 A1* | 9/2017 | Adusumilli | H01L 29/665 |
| 2017/0278746 A1* | 9/2017 | Siew | H01L 21/76877 |
| 2018/0211872 A1* | 7/2018 | Wu | H01L 21/28568 |
| 2018/0254181 A1* | 9/2018 | Ishizaka | H01L 21/28556 |
| 2018/0347041 A1* | 12/2018 | Kim | H01L 21/76877 |
| 2019/0164817 A1* | 5/2019 | Khaderbad | H01L 23/485 |
| 2019/0164825 A1* | 5/2019 | Yang | H01L 21/2855 |
| 2019/0214296 A1* | 7/2019 | Wang | H01L 21/76879 |
| 2020/0066585 A1* | 2/2020 | Lin | H01L 23/53242 |
| 2020/0083098 A1* | 3/2020 | Satoh | C23C 16/46 |
| 2020/0090991 A1* | 3/2020 | Yu | H01L 21/76847 |
| 2020/0111675 A1* | 4/2020 | Takatsuki | C23C 16/45525 |
| 2020/0303250 A1* | 9/2020 | Cen | H01L 21/32136 |
| 2020/0343136 A1* | 10/2020 | Yu | H01L 23/53252 |
| 2021/0047725 A1* | 2/2021 | Woodruff | C23C 16/45527 |

FOREIGN PATENT DOCUMENTS

| | | |
|---|---|---|
| KR | 1020180063317 A | 6/2018 |
| KR | 1020180101226 A | 9/2018 |

\* cited by examiner

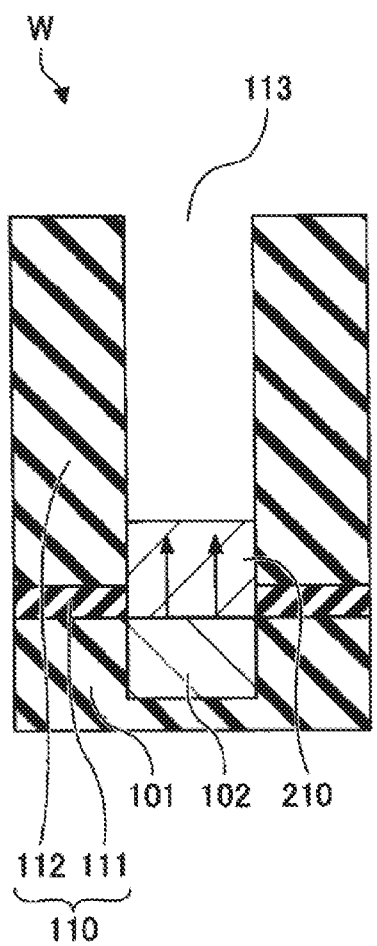

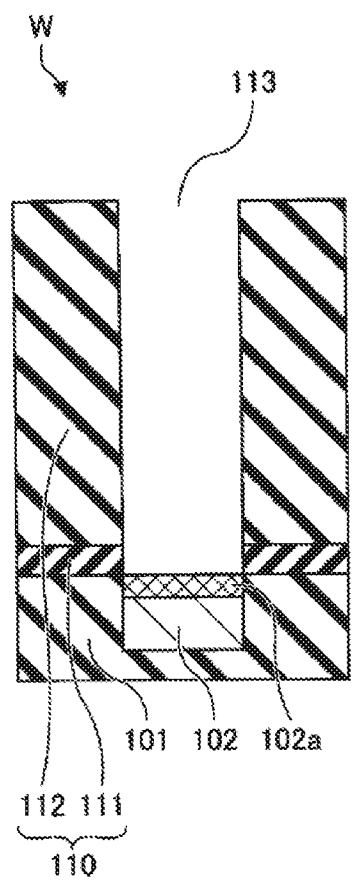

EMBEDDING METHOD AND PROCESSING SYSTEM

CROSS-REFERENCE TO RELATED APPLICATION

This application is based upon and claims the benefit of priority from Japanese Patent Application No. 2018-176468, filed on Sep. 20, 2018, the entire contents of which are incorporated herein by reference.

TECHNICAL FIELD

The present disclosure relates to an embedding method and a processing system.

BACKGROUND

For example, a process of embedding a metal material such as ruthenium in a recess such as a trench, a via hole, or a contact hole provided in an insulating layer is known.

Patent Document 1 discloses a method of manufacturing a semiconductor device having a step of forming a ruthenium film or ruthenium oxide film on a substrate using a gas obtained by vaporizing a liquid raw material for ruthenium and an oxygen-containing gas.

PRIOR ART DOCUMENT

Patent Documents

Patent Document 1: Japanese laid-open publication No. 2008-22021

SUMMARY

According to an embodiment, there is provided an embedding method including: removing a metal oxide film at a surface of a metal layer from a substrate that includes the metal layer on a bottom of a recess formed in an insulating layer, covering the surface of the metal layer by embedding ruthenium in the recess from the bottom of the recess; forming a ruthenium liner film in the recess; and further embedding ruthenium in the recess in which the liner film is formed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 3A to 3E are schematic cross-sectional views of a wafer illustrating respective steps of an embedding method according to an embodiment.

FIGS. 4A to 4D are schematic sectional views of a wafer W illustrating respective steps of an embedding method according to a first comparison example.

DETAILED DESCRIPTION

Figure 1:
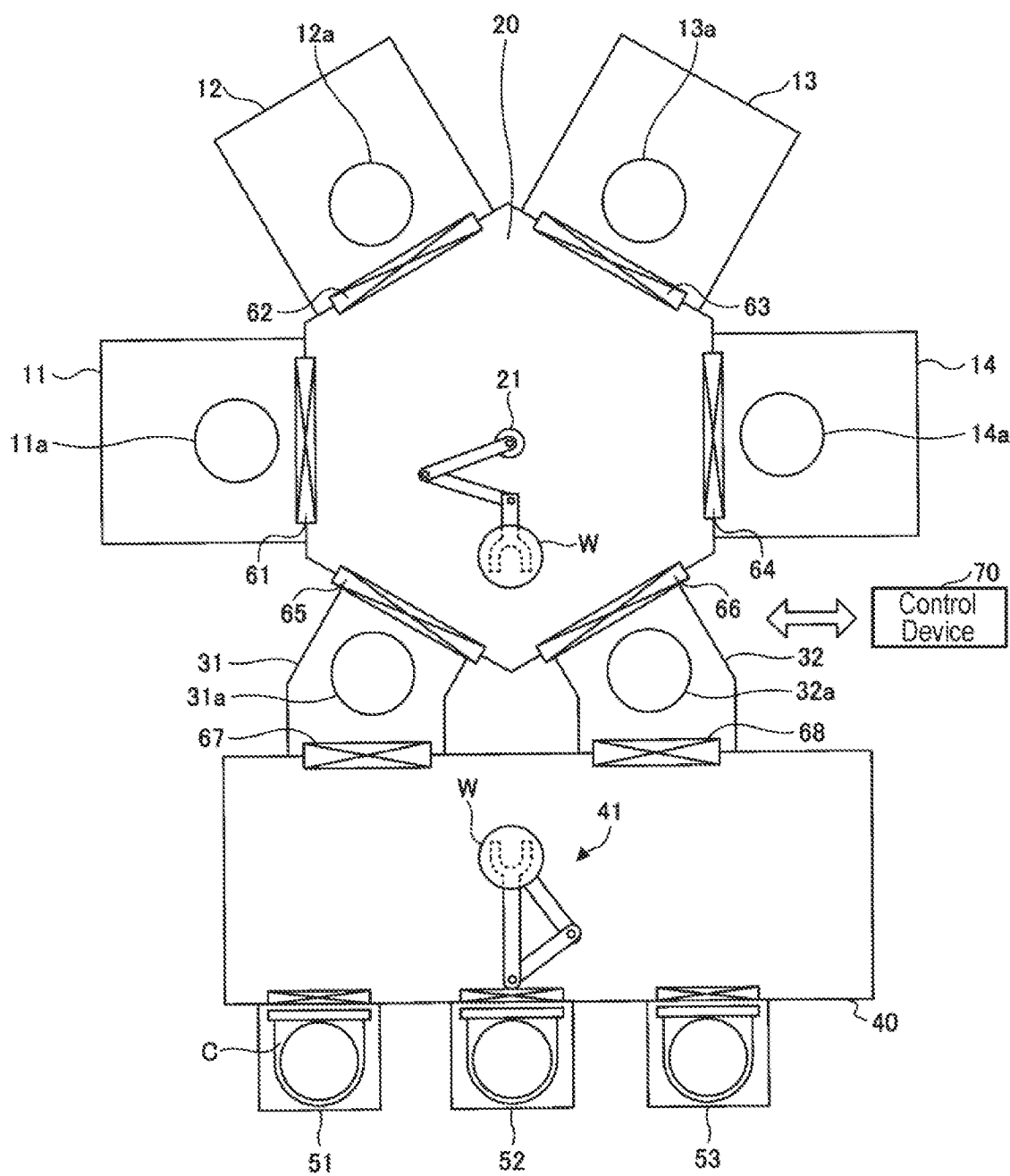
FIG. 1 is a schematic plan view illustrating an exemplary processing system used for an embedding method according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions may be omitted.

<Processing System>

First, a processing system used for an embedding method according to an embodiment will be described with reference to FIG. 1. FIG. 1 is a schematic plan view illustrating an exemplary processing system used for an embedding method according to the embodiment.

The processing system includes processing chambers 11 to 14, a vacuum transport chamber 20, load-lock chambers 31 and 32, an atmospheric transport chamber 40, load ports 51 to 53, gate valves 61 to 68, and a control device 70.

The processing chamber 11 has a stage 11a configured to place a semiconductor wafer W (hereinafter, referred to as a "wafer W") thereon, and is connected to the vacuum transport chamber 20 via a gate valve 61. Similarly, the processing chamber 12 has a stage 12a configured to place a wafer W thereon, and is connected to the vacuum transport chamber 20 via a gate valve 62. The processing chamber 13 has a stage 13a configured to place a wafer W thereon, and is connected to the vacuum transport chamber 20 via a gate valve 63. The processing chamber 14 has a stage 14a configured to place a wafer W thereon, and is connected to the vacuum transport chamber 20 via a gate valve 64. The inside of each of the processing chambers 11 to 14 is depressurized to a predetermined vacuum atmosphere, and desired processes (e.g., an etching process, a film-forming process, a cleaning process, and an ashing process) are performed on wafers W therein. The operation of each part for the processes in the processing chambers 11 to 14 is controlled by the control device 70.

The inside of the vacuum transport chamber 20 is depressurized to a predetermined vacuum atmosphere. In addition, in the vacuum transport chamber 20, a transport mechanism 21 is provided. The transport mechanism 21 transports wafers W to the processing chambers 11 to 14 and the load-lock chambers 31 and 32. The operation of the transport mechanism 21 is controlled by the control device 70.

The load-lock chamber 31 has a stage 31a configured to place a wafer W thereon, and is connected to the vacuum transport chamber 20 via the gate valve 65 and to the atmospheric transport chamber 40 via the gate valve 67. Similarly, the load-lock chamber 32 has a stage 32a configured to place a wafer W thereon, and is connected to the vacuum transport chamber 20 via the gate valve 66 and to the atmospheric transport chamber 40 via the gate valve 68. The inside of each of the load-lock chambers 31 and 32 is configured to be capable of being switched between an air atmosphere and a vacuum atmosphere. In addition, the switching between the vacuum atmosphere and the air atmosphere in each of the load-lock chambers 31 and 32 is controlled by the control device 70.

The inside of the atmosphere transport chamber 40 is in an air atmosphere, and, for example, a downflow of clean air is formed therein. In addition, the vacuum transport chamber 40 is provided with a transport mechanism 41. The transport mechanism 41 transports wafers W to the load-lock chambers 31 and 32 and carriers C in load ports 51 to 53 described later. The operation of the transport mechanism 41 is controlled by the control device 70.

The load ports 51 to 53 are provided in the wall of a long side of the atmospheric transport chamber 40. A carrier C in which wafers W are accommodated or an empty carrier C is mounted in each of the load ports 51 to 53. As the carriers C, for example, front opening unified pods (FOUPs) may be used.

The gate valves 61 to 68 are configured to be capable of being opened and closed. In addition, the opening and closing of the gate valves 61 to 68 are controlled by the control device 70.

The control device 70 controls the entire processing system by performing, for example, the operations of the processing chambers 11 to 14, the operations of the transport mechanisms 21 and 41, the opening and closing of the gate valves 61 to 68, and the switching between the vacuum atmosphere and the air atmosphere in the load-lock chambers 31 and 32.

An exemplary operation of the processing system will be described.

For example, the control device 70 opens the gate valve 67 and controls the transport mechanism 41 to transport a wafer W accommodated in, for example, the carrier C in the load port 51 to the stage 31a of the load-lock chamber 31. The control device 70 closes the gate valve 67 to set the inside of the load-lock chamber 31 to a vacuum atmosphere.

The control device 70 opens the gate valves 61 and 65, and controls the transport mechanism 21 to transport the wafer W in the load-lock chamber 31 to the stage 11a of the load-lock chamber 11. The control device 70 closes the gate valves 61 and 65, and operates the processing chamber 11. Therefore, a predetermined process is performed on the wafer W in the processing chamber 11.

The control device 70 opens the gate valves 61 and 62, and controls the transport mechanism 21 to transport the wafer W in the processing chamber 11 to the stage 12a of the processing chamber 12. The control device 70 closes the gate valves 61 and 62, and operates the processing chamber 12. Therefore, a predetermined process is performed on the wafer W in the processing chamber 12.

The control device 70 opens the gate valves 62 and 63, and controls the transport mechanism 21 to transport the wafer W in the load-lock chamber 12 to the stage 13a of the processing chamber 13. The control device 70 closes the gate valves 62 and 63, and operates the processing chamber 13. Therefore, a predetermined process is performed on the wafer W in the processing chamber 13.

The control device 70 opens the gate valves 63 and 64, and controls the transport mechanism 21 to transport the wafer W in the load-lock chamber 13 to the stage 14a of the processing chamber 14. The control device 70 closes the gate valves 63 and 64, and operates the processing chamber 14. Therefore, a predetermined process is performed on the wafer W in the processing chamber 14.

The control device 70 opens the gate valves 64 and 66, and controls the transport mechanism 21 to transport the wafer W in the processing chamber 14 to the stage 32a of the load-lock chamber 32. The control device 70 closes the gate valves 64 and 66, and sets the inside of the load-lock chamber 32 to an air atmosphere. The control device 70 opens the gate valve 68, and controls the transport mechanism 41 to transport the wafer W in the load-lock chamber 32 to the carrier C in the load port 53 so that the wafer W is accommodated in the carrier C.

As described above, with the processing system illustrated in FIG. 1, while wafers W are being processed by respective processing chambers 11 to 14, predetermined processes may be continuously performed on the wafers W without exposing the wafers W to the air, that is, without breaking vacuum.

<Processing Apparatus>

Figure 2:
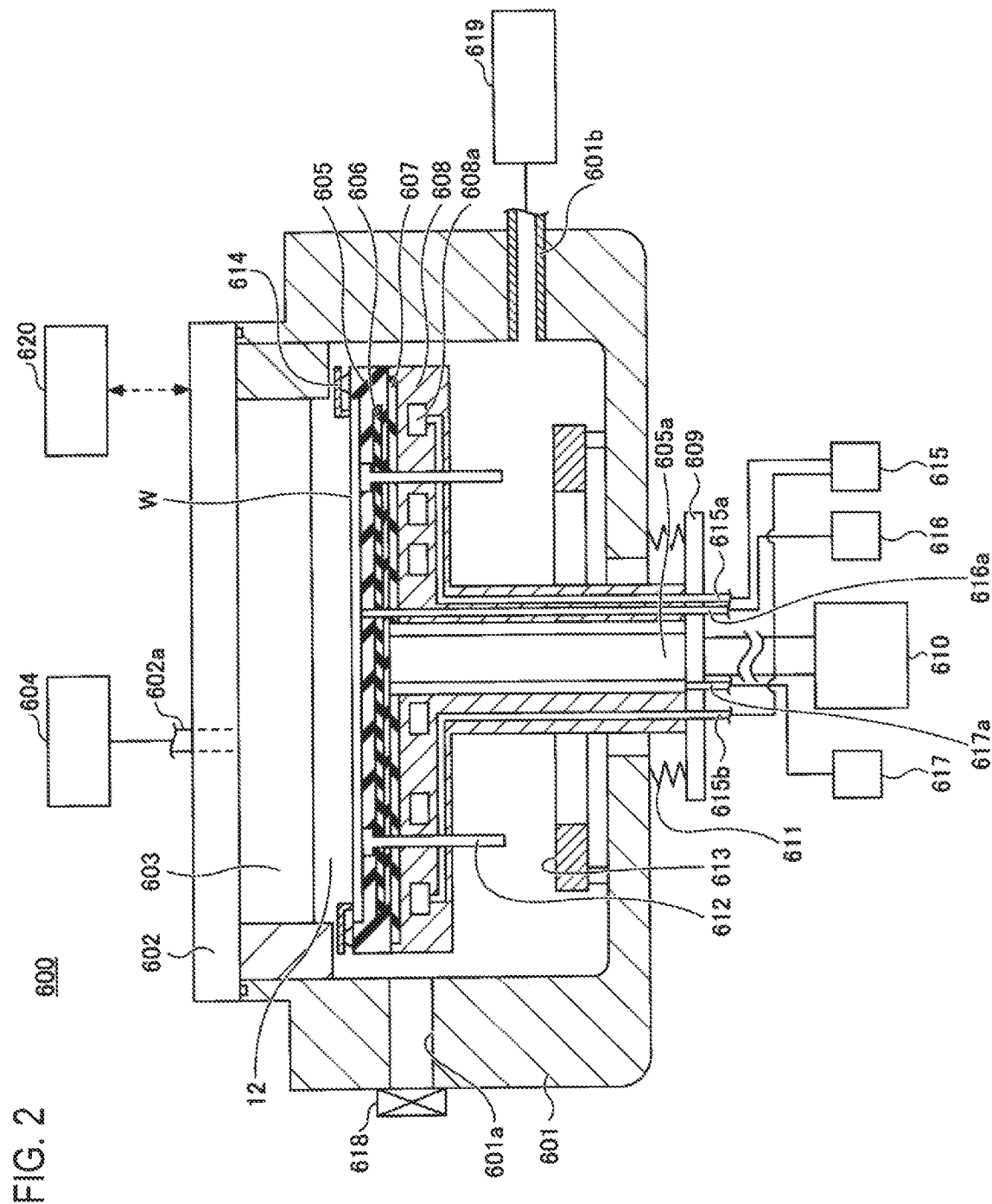
FIG. 2 is a schematic plan view illustrating an exemplary processing apparatus used for an embedding method according to an embodiment.

Next, an exemplary structure of a processing apparatus 600 for implementing a processing chamber used for an embedding method, which is a predetermined process according to an embodiment, will be described with reference to FIG. 2. FIG. 2 is a schematic cross-sectional view illustrating an exemplary processing apparatus 600 used for an embedding method according to the embodiment. The processing apparatus 600 illustrated in FIG. 2 is a chemical vapor deposition (CVD) apparatus, and performs an embedding step or a pre-cleaning step. For example, a process gas such as a ruthenium-containing gas is supplied to perform a predetermined process such as a process for forming a ruthenium film on a wafer W. Hereinafter, the processing apparatus 600 used for the processing chamber 12 will be described as an example.

A main body container 601 is a bottomed container having an opening at the upper side thereof. A support member 602 supports a gas ejection mechanism 603. In addition, when the support member 602 closes the upper opening of the main body container 601, the main body container 601 is sealed to form a processing chamber 12 (see also FIG. 1). A gas supply 604 supplies a process gas such as a ruthenium-containing gas or a carrier gas to the gas ejection mechanism 603 via a supply pipe 602a penetrating the support member 602. The ruthenium-containing gas and the carrier gas supplied from the gas supply 604 are supplied from the gas ejection mechanism 603 into the processing chamber 12.

A stage 605 is a member configured to place a wafer W thereon, and is illustrated as a stage 12a in FIG. 1. A heater 606 is provided inside the stage 605 to heat the wafer W. The stage 605 includes a support 605a, which extends downward from a center of a lower surface of the stage 605 and has an end that penetrates the bottom of the main body container 601 and is supported on a lift mechanism via a lift plate 609. In addition, the stage 605 is fixed on a temperature control jacket 608, which is a temperature control member, via a heat insulating ring 607. The temperature control jacket 608 has a plate that fixes the stage 605, a shaft extending downward from the plate and configured to cover the support 605a, and a hole penetrating the shaft from the plate.

The shaft of the temperature control jacket 608 penetrates the bottom of the main body container 601. A lower end of the temperature control jacket 608 is supported by the lift mechanism 610 via the lift plate 609 disposed below the main body container 601. Since a bellows 611 is provided between the bottom of the main body container 601 and the lift plate 609, the airtightness in the main body container 601 is also maintained by the vertical movement of the lift plate 609.

When the lift mechanism 610 raises and lowers the lift plate 609, the stage 605 is capable of being raised and lowered between a processing position (see FIG. 2) at which the wafer W is processed, and a delivery position (not illustrated) at which the wafer W is delivered between the stage 605 and an external transport mechanism 21 (see FIG. 1) via a loading and unloading port 601a.

Lift pins 612 support the wafer W from the lower surface of the wafer W and lift the wafer W from a placement surface of the stage 605 when the wafer W is delivered between the stage 605 and the external transport mechanism 21 (see FIG. 1). Each of the lift pins 612 has a shaft portion and a head portion having a diameter larger than that of the shaft portion. Through-holes are formed through the stage 605 and the plate of the temperature control jacket 608, and the shaft portions of the lift pins 612 are inserted through the through-holes, respectively. In addition, on the placement surface side of the stage 605, recesses are formed for accommodating the head portions of the lift pins 612, respectively. An abutment member 613 is disposed below the lift pins 612.

In the state in which the stage 605 is moved to the processing position of the wafer W (see FIG. 2), head portions of the lift pins 612 are accommodated in the recesses, and the wafer W is placed on the placement surface of the stage 605. In addition, the head portions of the lift pins 612 are engaged in the recesses, the shaft portions of the lift pins 612 pass through the stage 605 and the plate of the temperature control jacket 608, and the lower ends of the shaft portions of the lift pins 612 protrude from the plate of the temperature control jacket 608. Meanwhile, in the state in which the stage 605 is moved to the delivery position (not illustrated) of the wafer W, the lower ends of the lift pins 612 abut the abutment member 613 and the head portions of the lift pins 612 protrude from the placement surface of the stage 605. As a result, the head portions of the lift pins 612 support the wafer W from the lower surface of the wafer W, and lift the wafer W from the placement surface of the stage 605.

An annular member 614 is disposed above the stage 605. When the stage 605 is moved to the processing position of the wafer W (see FIG. 2), the annular member 614 comes into contact with the outer peripheral portion of the upper surface of the wafer W, and the wafer W is pressed against the placement surface of the stage 605 by the weight of the annular member 614. Meanwhile, in the state in which the stage 605 is moved to the delivery position (not illustrated) of the wafer W, the annular member 614 is engaged with an engagement portion (not illustrated) above the loading and unloading port 601a. Thus, the delivery of the wafer W by the transport mechanism 21 (see FIG. 1) is not hindered.

A chiller 615 circulates a coolant (e.g., cooling water) through a flow path 608a formed in the plate of the temperature control jacket 608 via pipes 615a and 615b.

A heat transfer gas supply 616 supplies a heat transfer gas (e.g., He gas) to a space between the rear surface of the wafer W placed on the stage 605 and the placement surface of the stage 605 via a pipe 616a.

A purge gas supply 617 causes a purge gas to flow via a pipe 617a, a gap formed between the support 605a of the stage 605 and the hole in the temperature control jacket 608, a flow path (not illustrated) formed between the stage 605 and the heat insulating ring 607 and extending toward the radial outside, and a vertical flow path (not illustrated) formed at the outer peripheral portion of the stage. Then, via these flow paths, the purge gas (e.g., $CO_2$ gas) is supplied between the lower surface of the annular member 614 and the upper surface of the stage 605. Thus, the process gas is prevented from flowing into the space between the lower surface of the annular member 614 and the upper surface of the stage 605, thereby preventing a film from being formed on the lower surface of the annular member 614 or the upper surface of the outer peripheral portion of the stage 605.

The side wall of the main body container 601 is provided with a loading and unloading port 601a for loading and unloading a wafer W therethrough and a gate valve 618 for opening and closing the loading and unloading port 601a. FIG. 1 illustrates the gate valve 618 as the gate valve 62.

An exhauster 619 including a vacuum pump or the like is connected to the lower side wall of the main body container 601 via an exhaust pipe 601b. The inside of the main body container 601 is evacuated by the exhauster 619, so that the inside of the processing chamber 12 is set and maintained at a predetermined vacuum atmosphere (e.g., 1.33 Pa).

A control device 620 controls the operation of the processing apparatus 600 by controlling the gas supply 604, the heater 606, the lift mechanism 610, the chiller 615, the heat transfer gas supply 616, the purge gas supply 617, the gate valve 618, the exhauster 619, and the like. In addition, the control device 620 may be provided independently of the control device 70 (see FIG. 1), or the control device 70 may also serve as the control device 620.

An exemplary operation of the substrate processing system 600 will be described. At the time of start, the inside of the processing chamber 12 is in a vacuum atmosphere by the exhauster 619. In addition, the stage 605 is moved to the delivery position.

The control device 620 opens the gate valve 618. Here, a wafer W is placed on the lift pins 612 by the external transport mechanism 21. When the transport mechanism 21 comes out of the loading and unloading port 601a, the control device 620 closes the gate valve 618.

The control device 620 controls the lift mechanism 610 to move the stage 605 to the processing position. In this operation, as the stage 605 is raised, the wafer W placed on the lift pins 612 is placed on the placement surface of the stage 605. In addition, the annular member 614 comes into contact with the outer peripheral portion of the upper surface of the wafer W, and presses the wafer W against the placement surface of the stage 605 by its own weight.

At the processing position, the control device 620 operates the heater 606, and controls the gas supply 604 to supply a process gas such as ruthenium-containing gas or a carrier gas from the gas ejection mechanism 603 into the processing chamber 12. As a result, a predetermined process such as film formation is performed on the wafer W. After the process, the gas passes through the flow path on the upper surface side of the annular member 614, and is exhausted by the exhauster 619 through the exhaust pipe 601b.

In this operation, the control device 620 controls the heat transfer gas supply 616 to supply a heat transfer gas between the rear surface of the wafer W placed on the stage 605 and the placement surface of the stage 605. In addition, the control device 620 controls the purge gas supply 617 to supply a purge gas between the lower surface of the annular member 614 and the upper surface of the stage 605. The purge gas passes through the flow path on the lower surface side of the annular member 614, and is exhausted by the exhauster 619 through the exhaust pipe 601b.

When the predetermined processing is completed, the control device 620 controls the lift mechanism 610 to move the stage 605 to a receiving position. In this operation, by lowering the stage 605, the annular member 614 is engaged with an engagement portion (not illustrated). In addition, when the lower ends of the lift pins 612 abut the abutment member 613, the heads of the lift pins 612 protrude from the placement surface of the stage 605 and lift the wafer W from the placement surface of the stage 605.

The control device 620 opens the gate valve 618. Here, the wafer W placed on the lift pins 612 is unloaded by the external transport mechanism 21. When the transport mechanism 21 comes out of the loading and unloading port 601a, the control device 620 closes the gate valve 618.

As described above, with the processing apparatus 600 illustrated in FIG. 2, a predetermined process such as film formation may be performed on a wafer W. Although the processing apparatus 600 having the processing chamber 12 has been described, the processing apparatus having the processing chamber 11, the processing apparatus having the processing chamber 13, and the processing apparatus having the processing chamber 14 may each have a configuration, which is the same as or different from that of the processing apparatus 600.

<Embedding Method According to Embodiment>

Next, a method of embedding a recess 113 in a wafer W using ruthenium according to an embodiment will be described with reference to FIGS. 3A to 3E. FIGS. 3A to 3E are schematic cross-sectional views of a wafer W illustrating respective steps of an embedding method according to the embodiment.

Figure 3A:
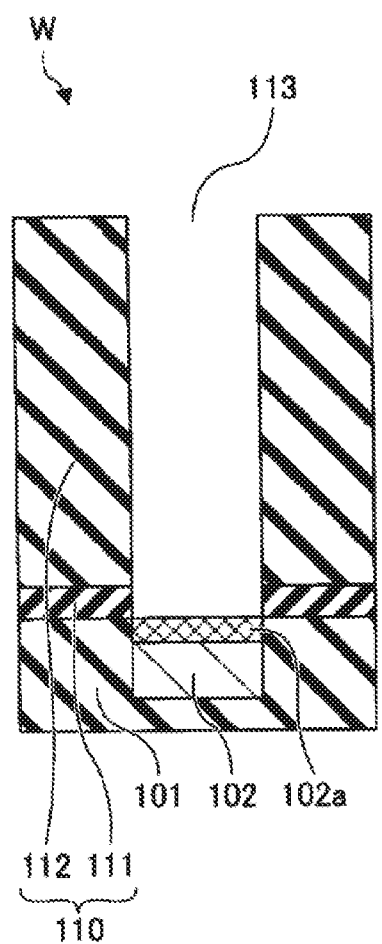

FIG. 3A is a schematic cross-sectional view illustrating a wafer W supplied to the processing system. As illustrated in FIG. 3A, the wafer W supplied to the processing system has an insulating film 110 formed to be stacked on a base film 101. A metal layer 102 is formed on the base film 101. As the material of the metal layer 102, a metal material, which does not allow ruthenium to diffuse therein, may be used, and, for example, tungsten, copper, or ruthenium may be used.

The insulating film 110 formed on the base film 101 is formed by stacking, for example, a silicon nitride film 111 and a silicon oxide film 112. However, it is possible to select any material as the material of the insulating film 110 as long as the film-forming rate of ruthenium on the metal layer 102 is higher than the film-forming rate of ruthenium on the insulating film 110. In addition, the insulating film 110 is not limited to stacked films of a combination of silicon-containing films, and may be a single layer film of a silicon-containing film.

In addition, in the insulating film 110, a recess 113 such as a trench, a via hole, or a contact hole is formed. The metal layer 102 is formed in a bottom of the recess 113.

For example, a metal oxide film 102a naturally oxidized by, for example, oxygen in the air atmosphere is formed on a surface of the metal layer 102 that is exposed in the bottom of the recess 113.

Figure 3B:
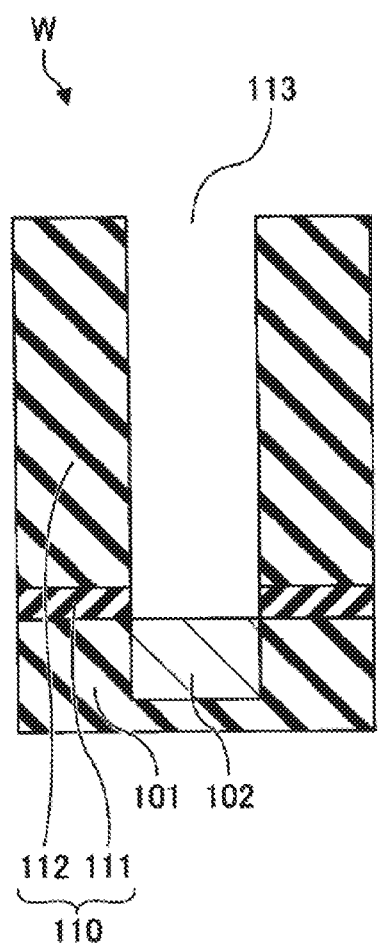

FIG. 3B is a schematic cross-sectional view illustrating the wafer W after a pre-cleaning step. In the pre-cleaning step, the metal oxide film 102a at the surface of the metal layer 102 is removed. The method of removing the metal oxide film 102a is not limited, and the metal oxide film 102a may be removed, for example, by reduction or by etching.

In addition, the pre-cleaning step is performed in the processing chamber 11 (see FIG. 1). For example, an etching apparatus, a plasma CVD apparatus, or a thermal CVD apparatus may be used as the processing chamber 11 in which the pre-cleaning step is performed.

FIG. 3C is a schematic cross-sectional view illustrating the wafer W after a first embedding step. In the first embedding step, ruthenium is embedded from the bottom of the recess 113 to form a ruthenium-embedded layer 210 covering the surface of the metal layer 102.

Here, in the first embedding step, a method of forming a ruthenium film, which does not use oxygen gas, may be used. This makes it possible to prevent the surface of the metal layer 102 on the bottom of the recess 113 from being oxidized again by oxygen gas.

In the first embedding step, a method of forming a ruthenium film is performed by selecting a material as the material of the insulating film 110 such that the rate of forming the ruthenium film on the metal layer 102 is higher than the rate of forming the ruthenium film on the insulating film 110. This makes it possible to embed ruthenium from the bottom of the recess 113, and thus to suppress the creation of voids and seams while covering the surface of the metal layer 102.

In addition, the first embedding step is performed in the processing chamber 12 (see FIG. 1). For example, a thermal CVD apparatus may be used as the processing chamber 12 in which the first embedding step is performed. For example, a gas containing dodecacarbonyltriruthenium ($Ru_3(CO)_{12}$) is supplied into the processing chamber 12, and a wafer W placed on the stage 12a is heated. A ruthenium film is formed by the thermal decomposition of $Ru_3(CO)_{12}$ adsorbed on the surface of the wafer W. Here, in the film forming method based on the thermal decomposition of $Ru_3(CO)_{12}$, a film forming rate on the surface of the metal layer 102 of, for example, tungsten, copper, or ruthenium is higher than a film forming rate on the surface of the insulating film 110 (the silicon nitride film 111 and the silicon oxide film 112). Therefore, film formation is faster from the bottom of the recess 113 than film deposition from the side surface of the recess 113, and, as indicated by arrows in FIG. 3C, the ruthenium-embedded layer 210 is formed in a bottom-up fashion from the bottom of the recess 113.

Although the first embedding step has been described as forming a film using $Ru_3(CO)_{12}$, the present disclosure is not limited thereto. For example, (2,4 dimethylpentadienylethylcyclopentadienyl)ruthenium: (Ru(DMPDXEtCp)), bis(2, 4-dimethylpentadienyl)ruthenium: (Ru (DMPD)$_2$), (4-dimethylpentadienyl) (methylcyclopentadienyl)ruthenium: (Ru (DMPD)(MeCp)), bis(cyclopentadienyl)ruthenium; (Ru ($C_5H_5$)$_2$), or cis-dicarbonyl bis(5-methylhexane-2,4-dionate)ruthenium (II) may be used.

Figure 3D:
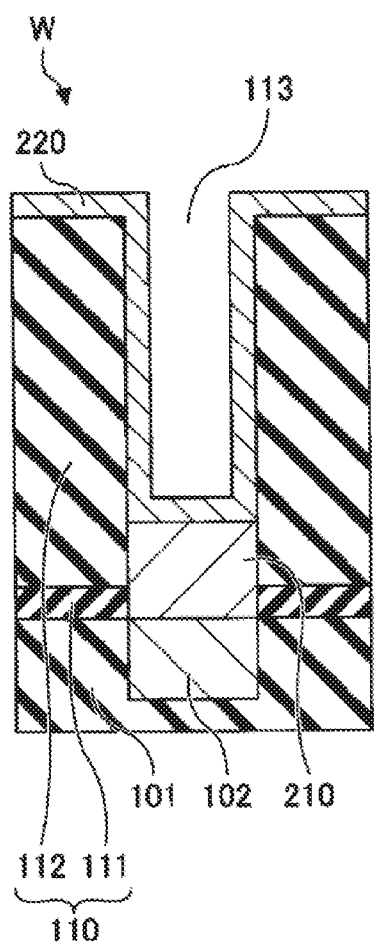

FIG. 3D is a schematic cross-sectional view illustrating the wafer W after a second embedding step. In the second embedding step, a conformal ruthenium liner film 220 is formed on the side surface and the bottom of the recess 113.

Here, in the second embedding step, it is preferable to use a method of forming a ruthenium film using a gas containing a ruthenium compound having a hydrocarbon group and oxygen gas. Thereby, it is possible to form a ruthenium film on the surface of the ruthenium-embedded layer 210 which is the bottom of the recess 113 and on the surface of the insulating film 110 (the silicon nitride film 111 and the silicon oxide film 112), which is the side surface of the recess 113.

In addition, the second embedding step is performed in the processing chamber 13 (see FIG. 1). For example, a thermal CVD apparatus may be used as the processing chamber 13 in which the second embedding step is performed. For example, a gas containing dimethylbutadiene ruthenium tricarbonyl (Ru(DMBD)(CO)$_3$) and oxygen gas ($O_2$) are supplied into the processing chamber 12, and the wafer W placed on the stage 13a is heated. A ruthenium film is formed by reducing the Ru(DMBDXCO)$_3$ adsorbed on the surface of the wafer W with the oxygen gas.

In addition, in the second embedding step, the ruthenium-embedded layer 210 covering the surface of the metal layer 102 also functions as a barrier film for preventing the diffusion of oxygen. Thereby, since the oxygen supplied in the second embedding step does not reach the surface of the metal layer 102, it is possible to prevent the surface of the metal layer 102 from being oxidized.

Although the second embedding step has been described as forming a film using a gas containing Ru(DMBDXCO)$_3$ and oxygen gas, the present disclosure is not limited thereto. For example, (2,4 dimethylpentadienylethylcyclopentadienyl)ruthenium: (Ru(DMPD)(EtCp)), bis(2,4-dimethylpentadienyl)ruthenium: (Ru (DMPD)$_2$), (4-dimethylpentadienyl) (methylcyclopentadienyl)ruthenium: (Ru(DMPD)(MeCp)), bis(cyclopentadienyl)ruthenium: (Ru(C$_5$H$_5$)$_2$), or cis-dicarbonyl bis(5-methylhexane-2,4-dionate)ruthenium (II) may be used.

Figure 3E:
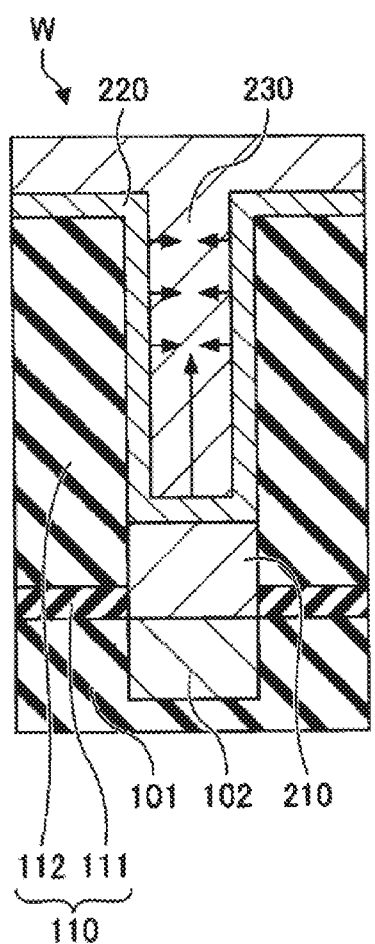

FIG. 3E is a schematic cross-sectional view illustrating the wafer W after a third embedding step. In the third embedding step, ruthenium is embedded in the recess 113 in which the ruthenium liner film 220 is formed to form a ruthenium-embedded layer 230.

In addition, the third embedding step is performed in the processing chamber 14 (see FIG. 1). For example, a thermal CVD apparatus may be used as the processing chamber 14 in which the third embedding step is performed. For example, a gas containing Ru$_3$(CO)$_{12}$) is supplied into the processing chamber 14, and a wafer W placed on the stage 14a is heated. A ruthenium film is formed by the thermal decomposition of Ru$_3$(CO)$_{12}$ adsorbed on the surface of the wafer W. Here, the ruthenium liner film 220 is formed on the side surface and bottom of the recess 113. Therefore, as indicated by the arrows in FIG. 3E, a ruthenium film is deposited from the side surface and the bottom of the recess 113.

In addition, in the recess 113, a difference in concentration of gas occurs between the upper side and the lower side (bottom), and as indicated by the lengths of the arrows in FIG. 3E, the film forming rate on the bottom of the recess 113 is higher than the film forming rate on the side surface of the recess 113. Therefore, the ruthenium-embedded layer 230 is formed in a bottom-up fashion from the bottom of the recess 113. This makes it possible to suppress the creation of voids and seams.

Although the third embedding step has been described as forming a film using Ru$_3$(CO)$_{12}$, the present disclosure is not limited thereto. For example, (2,4 dimethylpentadienylethylcyclopentadienyl)ruthenium: (Ru(DMPDXEtCp)), bis(2,4-dimethylpentadienyl)ruthenium: (Ru (DMPD)$_2$), (4-dimethylpentadienyl) (methylcyclopentadienyl)ruthenium: (Ru (DMPD)(MeCp)), bis(cyclopentadienyl)ruthenium: (Ru (C$_5$H$_5$)$_2$), or cis-dicarbonyl bis(5-methylhexane-2,4-dionate)ruthenium (II) may be used.

<Embedding Method According to Comparison Example>

Here, a method of embedding a recess 113 in a wafer W using ruthenium according to comparison examples will be described with reference to FIGS. 4A to 4D, FIGS. 5A to 5C, and FIGS. 6A to 6D.

<Embedding Method According to First Comparison Example>

FIGS. 4A to 4D are schematic sectional views of a wafer W illustrating respective steps of an embedding method according to a first comparison example.

FIG. 4A is a schematic cross-sectional view illustrating a wafer W supplied to the processing system. As illustrated in FIG. 4A, the wafer W supplied to the processing system has a metal oxide film 102a formed on the surface of a metal layer 102 exposed on the bottom of a recess 113.

Figure 4B:
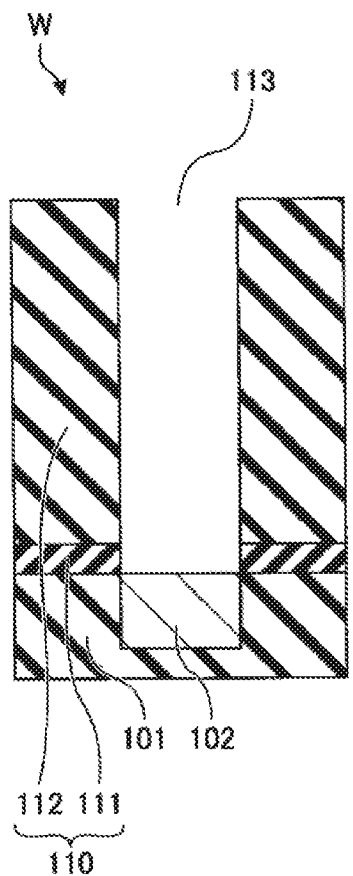

FIG. 4B is a schematic cross-sectional view illustrating the wafer W after a pre-cleaning step. In the pre-cleaning step of the first comparison example, the metal oxide film 102a of the metal layer 102 is removed as in the pre-cleaning step of the embodiment.

Figure 4C:
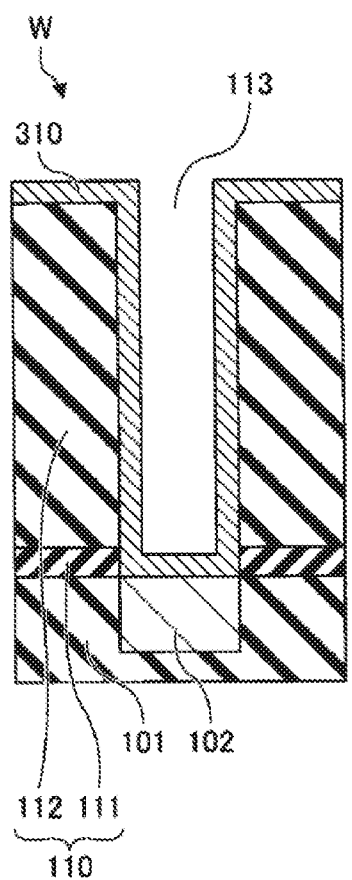

FIG. 4C is a schematic cross-sectional view illustrating the wafer W after a first embedding step of the first comparison example. In the first embedding step of the first comparison example, a conformal liner film 310 is formed. For example, a liner film of TaN is formed.

Figure 4D:
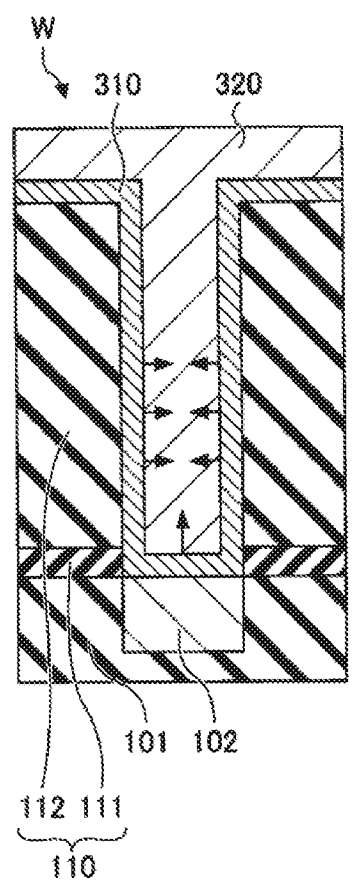

FIG. 4D is a schematic cross-sectional view illustrating the wafer W after a second embedding step of the first comparison example. In the second embedding step of the first comparison example, ruthenium is embedded in the recess 113, in which the liner film 310 is formed, using Ru$_3$(CO)$_{12}$ as in the third embedding step of the embodiment, thereby forming a ruthenium-embedded layer 320.

In the first comparison example, the TaN liner film 310 is formed. As a result, when ruthenium is embedded in the second embedding step, a ruthenium film is formed from the side surface and the bottom of the recess 113 as indicated by arrows in FIG. 4D, so that it is possible to shorten the time required for embedding. Meanwhile, it is impossible to reduce a contact resistance by forming the TaN liner film 310, which has a resistivity higher than that of ruthenium.

<Embedding Method According to Second Comparison Example>

Figure 5A:
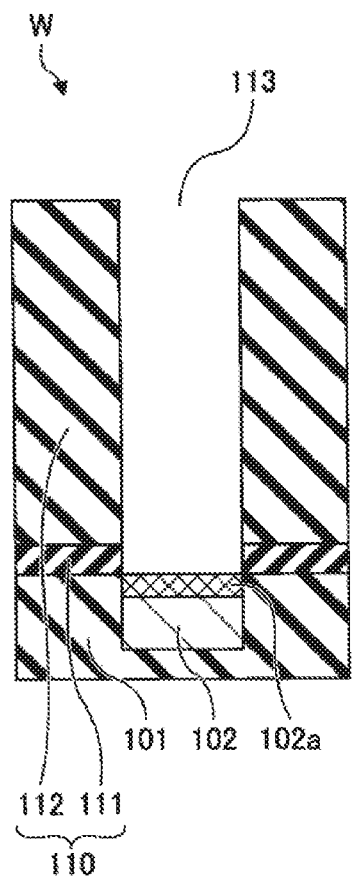
FIGS. 5A to 5C are schematic sectional views of a wafer W illustrating respective steps of an embedding method according to a second comparison example.
Figure 5B:
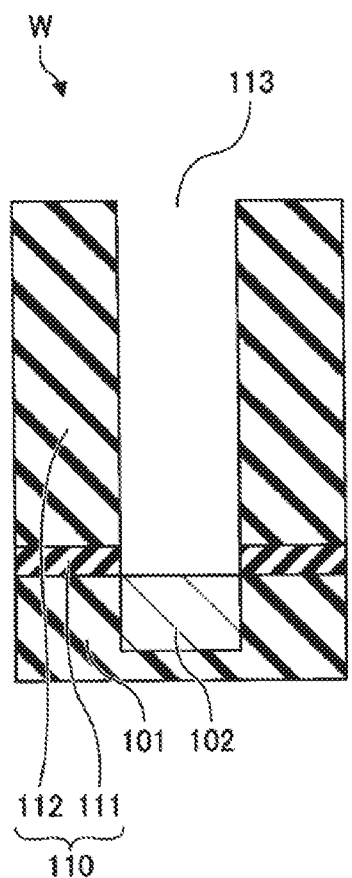
Figure 5C:
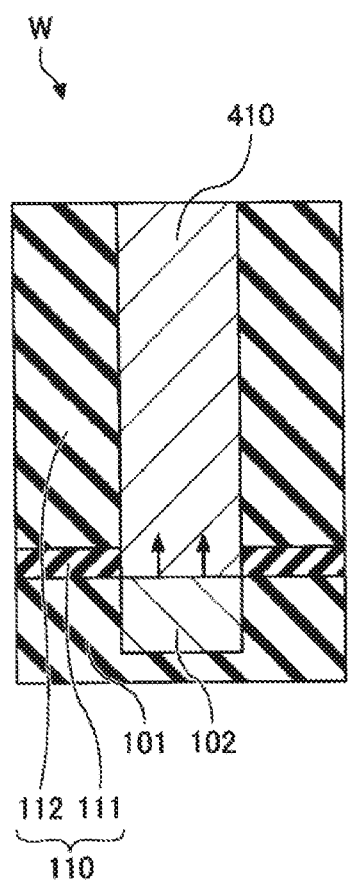

FIGS. 5A to 5C are schematic sectional views of a wafer W illustrating respective steps of an embedding method according to a second comparison example.

FIG. 5A is a schematic cross-sectional view illustrating a wafer W supplied to the processing system. As illustrated in FIG. 5A, the wafer W supplied to the processing system has a metal oxide film 102a formed on the surface of a metal layer 102 exposed on the bottom of a recess 113.

FIG. 5B is a schematic cross-sectional view illustrating the wafer W after a pre-cleaning step. In the pre-cleaning step of the second comparison example, the metal oxide film 102a of the metal layer 102 is removed as in the pre-cleaning step of the embodiment.

FIG. 5C is a schematic cross-sectional view illustrating the wafer W after an embedding step of the second comparison example. In the embedding step of the second comparison example, ruthenium is embedded from the bottom of the recess 113 using Ru$_3$(CO)$_{12}$ as in the first embedding step of the embodiment, thereby forming a ruthenium-embedded layer 410. In the embedding step of the second comparison example, the entire recess 113 is embedded.

In the second comparison example, since a TaN liner film is not used, it is possible to lower the electrical resistance compared to the first comparison example. Meanwhile, in the embedding step of the second comparison example, as indicated by arrows in FIG. 5C, the film forming rate from the side surface of the recess 113 is not promoted, and thus the film forming rate is low and the time required for embedding is prolonged.

<Embedding Method According to Third Comparison Example>

FIGS. 6A to 6D are schematic sectional views of a wafer W illustrating respective steps of an embedding method according to a third comparison example.

Figure 6A:
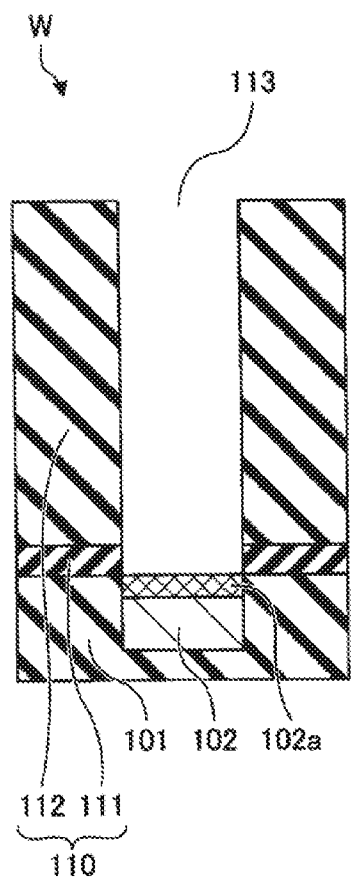
FIGS. 6A to 6D are schematic sectional views of a wafer W illustrating respective steps of an embedding method according to a third comparison example.

FIG. 6A is a schematic cross-sectional view illustrating a wafer W supplied to the processing system. As illustrated in FIG. 6A, the wafer W supplied to the processing system has a metal oxide film 102a formed on the surface of a metal layer 102 exposed on the bottom of a recess 113.

Figure 6B:
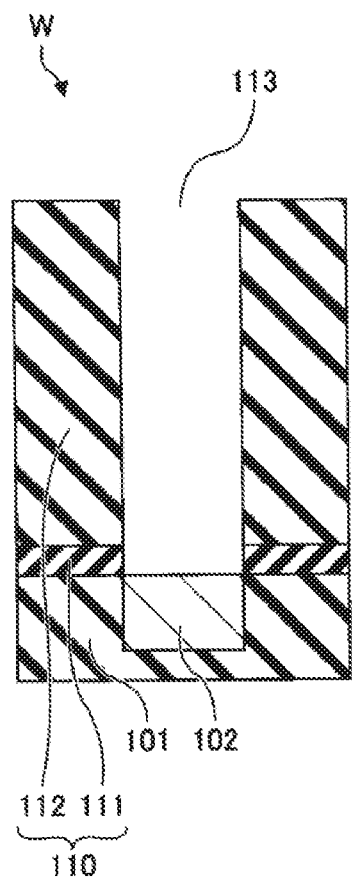

FIG. 6B is a schematic cross-sectional view illustrating the wafer W after a pre-cleaning step. In the pre-cleaning step of the third comparison example, the metal oxide film 102a of the metal layer 102 is removed as in the pre-cleaning step of the embodiment.

Figure 6C:
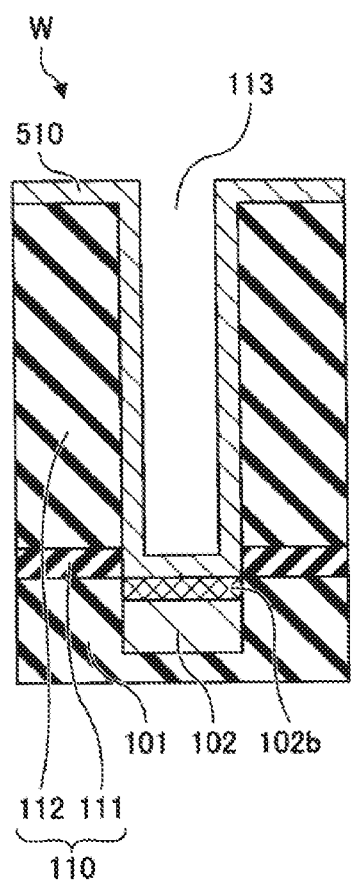

FIG. 6C is a schematic cross-sectional view illustrating the wafer W after a first embedding step of the third comparison example. In the first embedding step of the third comparison example, as in the second embedding step of the embodiment, a conformal ruthenium liner film 510 is formed using a gas containing Ru(DMBD)(CO)$_3$ and oxygen gas.

Figure 6D:
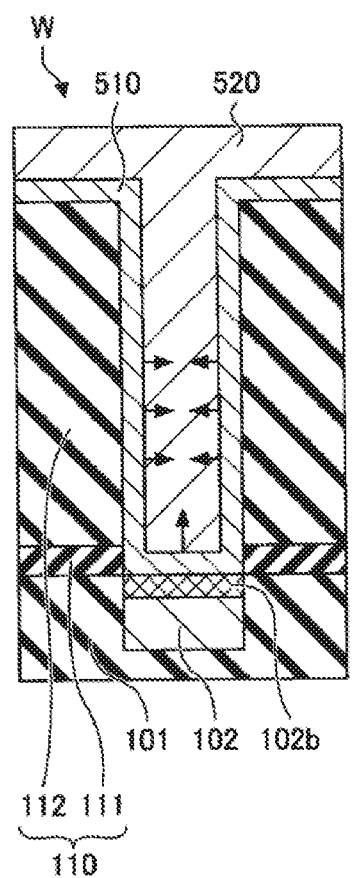

FIG. 6D is a schematic cross-sectional view illustrating the wafer W after a second embedding step of the third comparison example. In the second embedding step of the third comparison example, ruthenium is embedded in the recess 113, in which the ruthenium liner film 510 is formed, using Ru$_3$(CO)$_{12}$ as in the third embedding step of the embodiment, thereby forming a ruthenium-embedded layer 520.

In the third comparison example, the ruthenium liner film 510 is formed. As a result, when ruthenium is embedded in the second embedding step, a ruthenium film is formed from the side surface and the bottom of the recess 113 as indicated by arrows in FIG. 6D, so that it is possible to shorten the time required for embedding. Meanwhile, when forming the ruthenium liner film 510, a metal oxide film 102b is formed again by exposing the surface of the metal layer 102 to oxygen gas. The metal oxide film 102b increases a contact resistance.

<Action and Effect of Film Forming Method According to Embodiment>

The action and effect of the embedding method according to the embodiment will be described in comparison with the comparison examples.

According to the embedding method according to the embodiment, since it is possible to embed a recess 113 with ruthenium, it is possible to reduce an electric resistance compared with the first comparison example using a liner film made of a metal material having a high resistivity.

In addition, according to the embedding method according to the embodiment, before the ruthenium liner film 220 is formed, the surface of the metal layer 102 from which the metal oxide film 102a is removed in the pre-cleaning step is covered with the ruthenium-embedded layer 210. Thus, it is possible to prevent the surface of the metal layer 102 from being oxidized when the ruthenium liner film 220 is formed. Thereby, it is possible to reduce the electrical resistance compared to the third comparison example.

In addition, according to the embedding method according to the embodiment, the ruthenium liner film 220 is formed on the side surface and the bottom surface of the recess 113 before the recess 113 is embedded with ruthenium, it is possible to shorten the time required for embedding compared to the second comparison example, and thus it is possible to improve productivity.

As described above, according to the embedding method according to the embodiment, it is possible to achieve both improvement in productivity and low resistance.

In the foregoing, the embodiment of the present disclosure has been described in detail. However, the present disclosure is not limited to the embodiment described above. In the embodiment described above, various modifications, substitutions, and the like may be applied without departing from the scope of the present disclosure. In addition, it is possible to combine separately described features as long as no technical contradiction arises.

The number of processing chambers 11 to 14, the number of vacuum transport chambers 20, the number of load-lock chambers 31 and 32, the number of atmospheric transport chambers 40, the number of load ports 51 to 53, and the number of gate valves 61 to 68 are not limited to those illustrated in FIG. 1, but may be any number. In addition, it has been described that, in the processing system, the processing of the first embedding step is performed in the processing chamber 12 and the processing of the third embedding step is performed in the processing chamber 14. However, the processing system may be configured such that the processes of the first embedding and the third embedding step are performed in the processing chamber 12. This makes it possible to miniaturize the processing system by reducing the number of processing chambers.

It has been described that, in the third embedding step, ruthenium is embedded in the recess 113, in which the ruthenium liner film 220 is formed, using Ru$_3$(CO)$_{12}$ to form the ruthenium-embedded layer 230, but the present disclosure is not limited thereto. Subsequent to the second embedding step, ruthenium may be embedded in the recess 113 using a gas containing Ru(DMBDXCO)$_3$ and oxygen gas in the processing chamber 13 to form the ruthenium-embedded layer 230. This makes it possible to miniaturize the processing system by reducing the number of processing chambers.

One of a capacitively coupled plasma (CCP) type, an inductively coupled plasma (ICP) type, a radial line slot antenna (RLSA) type, an electron cyclotron resonance plasma (ECR) type, and a helicon wave plasma (HWP) type is applicable to the processing chambers of the present disclosure.

According to an aspect, it is possible to provide a method of embedding low-resistance ruthenium and a processing system while improving productivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An embedding method comprising:
   removing a metal oxide film at a surface of a metal layer from a substrate that comprises the metal layer on a bottom of a recess formed in an insulating layer;
   covering the surface of the metal layer by embedding ruthenium in the recess from the bottom of the recess;
   forming a ruthenium liner film in the recess; and
   further embedding ruthenium in the recess in which the liner film is formed,
   wherein a material of the metal layer is a metal material to which ruthenium does not diffuse,
   the material of the metal layer includes one of tungsten, copper, and ruthenium,
   in the covering the surface of the metal layer by embedding ruthenium in the recess from the bottom of the recess, no oxygen gas is used and a gas containing Ru$_3$(CO)$_{12}$ is used, and in the forming the ruthenium liner film in the recess, a gas containing a ruthenium component that comprises a hydrocarbon group and oxygen gas are used.

2. The embedding method of claim 1, wherein, in the forming the ruthenium liner film in the recess, a gas containing Ru(DMBD)(CO)$_3$ and oxygen gas are used.

3. The embedding method of claim 2, wherein, in the further embedding the ruthenium in the recess in which the liner film is formed, a gas containing Ru$_3$(CO)$_{12}$ is used.

4. The embedding method of claim 1, wherein, in the further embedding the ruthenium in the recess in which the liner film is formed, a gas containing Ru$_3$(CO)$_{12}$ is used.

5. The embedding method of claim 1, wherein, in the further embedding the ruthenium in the recess in which the liner film is formed, a gas containing Ru(DMBD)(CO)$_3$ and oxygen gas are used.

* * * * *